United States Patent [19]
Sugibayashi et al.

[11] Patent Number: 5,414,660
[45] Date of Patent: May 9, 1995

[54] DOUBLE WORD LINE TYPE DYNAMIC RAM HAVING REDUNDANT SUB-ARRAY OF CELLS

[75] Inventors: Tadahiko Sugibayashi; Isao Naritake; Tatsuya Matano, all of Tokyo, Japan

[73] Assignee: NEC Corporation, Tokyo, Japan

[21] Appl. No.: 129,854

[22] Filed: Sep. 30, 1993

[30] Foreign Application Priority Data

Oct. 1, 1992 [JP] Japan ................................. 4-263348

[51] Int. Cl.$^6$ ........................................... G11C 29/00
[52] U.S. Cl. .................................... 365/200; 365/63
[58] Field of Search ............... 365/200, 51, 63, 230.03

[56] References Cited

U.S. PATENT DOCUMENTS

| | | | |
|---|---|---|---|
| 4,839,864 | 6/1989 | Fujishima | 365/200 |
| 5,083,294 | 1/1992 | Okajima | 365/200 |
| 5,126,973 | 6/1992 | Gallia | 365/200 |
| 5,243,570 | 9/1993 | Saruwatari | 365/63 X |
| 5,257,229 | 10/1993 | McClure | 365/200 |
| 5,262,993 | 11/1993 | Horiguchi | 365/200 |
| 5,262,994 | 11/1993 | McClure | 365/200 |
| 5,265,055 | 11/1993 | Horiguchi | 365/200 |
| 5,289,417 | 2/1994 | Ooishi | 365/200 |
| 5,299,164 | 3/1994 | Takeuchi | 365/200 X |

OTHER PUBLICATIONS

"A Boosted Dual Word–line Decoding Scheme for 256Mb DRAMs", Noda, et al., IEEE, Feb., 1992, Symposium on VLSI Circuits Digest of Technical Papers.
"A Flexible Redundancy Technique for High–Density DRAM's", Horiguchi, et al., IEEE, Jan., 1991, Journal of Solid State Circuits.

Primary Examiner—Joseph A. Popek
Assistant Examiner—Son Mai

[57] ABSTRACT

In a double word line type dynamic RAM, redundant memory cells to be substituted for defective cells are concentrated so as to form only one redundant sub-array in a row direction and in a column direction. The size of the redundant sub-array is made smaller than that of regular sub-arrays each composed of only regular cells. Although a minimum unit of cells to be replaced together becomes large in the double word line type dynamic RAM, the increase of the redundant memory cells can be effectively suppressed.

2 Claims, 3 Drawing Sheets

DOUBLE WORD LINE TYPE DYNAMIC RAM HAVING REDUNDANT SUB-ARRAY OF CELLS

BACKGROUND OF THE INVENTION

1. Field of the Invention

The present invention relates to a dynamic RAM (random access memory) of a double word line type, and more specifically, to a defective cell substituting structure in the double word line type dynamic RAM.

2. Description of Related Art

Recent dynamic RAMs have adopted a so called double word line structure in order to overcome difficulties in microminiaturization of metal wiring conductors. This is reported in "1992 Symposium on VLSI Circuit Digest of Technical Papers", pages 112 to 113. The content of this article is incorporated herein by reference.

FIG. 1 shows a construction of one example of the double word line type dynamic RAM. In the double word line type dynamic RAM shown in FIG. 1, two word drivers 26 are connected to each pair of complementary main word lines 20 coupled to a corresponding main word decoder 24. Each of word drivers 26 is connected to a pair of corresponding word line selection voltage supply lines 30, so as to drive a pair of sub-word lines 22, which cross each pair of bit lines 27 coupled to a sense amplifier 28. At each intersection between the sub-word lines 22 and bit lines 27, a memory cell (not shown) is located. In the shown example, four sub-word lines 22 are extended from one pair of complementary main word lines 22.

In a conventional redundant system for the dynamic RAM, on the other hand, redundant cells are included in each sub-array, as shown in FIG. 2. This is proposed in "IEEE Journal of Solid State Circuits", Vol. 26, January 1991, pages 12 to 17. The content of this article is also incorporated herein by reference.

In FIG. 2, sub-arrays of memory cells are depicted by a pear-skin, and an array 28 of sense amplifiers "SA" is located between each pair of adjacent sub-arrays. The mark "x" indicates a defective cell, and a defective word line 32 containing a defective cell is replaced by a substitutional word line 34.

In this conventional redundant system, however, since the number of defective cells is not the same for each of the sub-arrays, there is little case in which all of substitutional cells are actually used.

If this conventional redundant system is applied in the double word line type dynamic RAM, it would become necessary to replace one set of main word lines (namely, four sub-word lines) together by another set. Therefore, the number of required substitutional word lines become non-negligible as compared with 512 word lines provided in each sub-array in ordinary dynamic RAM. In the case of 16 Mbit DRAM having 32 sub-arrays each of which includes 512 word lines, assuming that four redundant main word line pairs are provided for each sub-array, 512 redundant sub-word lines become necessary since 16 redundant sub-word lines are necessary for each one sub-array (16×32=512).

In this conventional redundant system for the dynamic-RAM, accordingly, since the substitutional cells are provided in each of the sub-arrays, a minimum unit of cells to be replaced together becomes large in the double word line type dynamic RAM. Therefore, a required chip area correspondingly becomes large. In addition, as mentioned above, since the number of defective cells contained in each sub-array is not at a constant, most of substitutional cells have not been actually used.

SUMMARY OF THE INVENTION

Accordingly, it is an object of the present invention to provide a double word line type dynamic RAM having redundant memory cells, which has overcome the above mentioned defect of the conventional one.

Another object of the present invention is to provide a double word line type dynamic RAM having redundant memory cells with a reduced chip area.

The above and other objects of the present invention are achieved in accordance with the present invention by a double word line type dynamic RAM having a plurality of regular sub-arrays of regular memory cells and a redundant sub-array composed of only redundant memory cells to be substituted for defective memory cells, the redundant sub-array being smaller in size than the regular sub-arrays.

The above and other objects, features and advantages of the present invention will be apparent from the following description of preferred embodiments of the invention with reference to the accompanying drawings.

DESCRIPTION OF THE PREFERRED EMBODIMENTS

Figure 3:
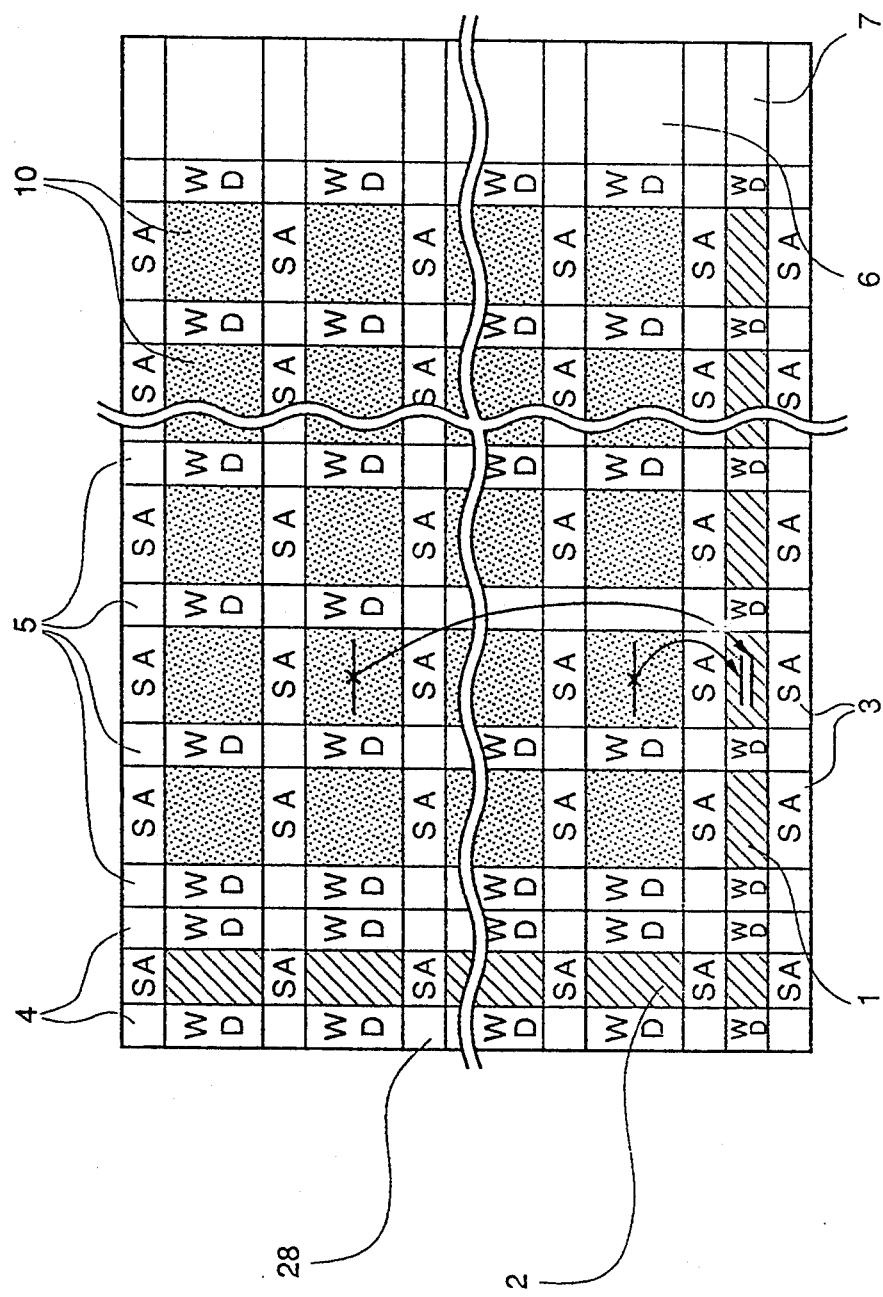
FIG. 3 is a diagrammatic layout illustrating one embodiment of the double word line type dynamic RAM in accordance with the present invention.

Referring to FIG. 3, there is shown a diagrammatic layout illustrating one embodiment of the double word line type dynamic RAM in accordance with the present invention.

In FIG. 3, a plurality of regular sub-arrays 10, each including a number of regular memory cells, are arranged in the form of a matrix in such a manner that, the regular sub-arrays 10 and word driver arrays "WD" 5 are alternately located in a row direction, and the regular sub-arrays 10 and sense amplifier arrays "SA" 28 are alternately located in a column direction. Main word decoders 6 are located along a column direction at a right side of a right end word driver arrays 5. Each of the regular sub-arrays 10 includes 128 pairs of complementary main word lines (512÷4=128).

Row redundant sub-arrays 1 are positioned at a lower side or outside of lower end sense amplifier arrays 28 for the regular sub-arrays 10, and redundant sense amplifier arrays 3 are located at a lower side or outside of the row redundant sub-arrays 1. Each of the row redundant sub-arrays 1 includes eight pairs of complementary main word lines. Therefore, the number of memory cells contained in the redundant sub-array 1 is remarkably smaller than the number of memory cells in the regular sub-array, and accordingly, the size of the redundant sub-array 1 is correspondingly remarkably smaller than the size of the regular sub-array. Each of eight pairs of complementary main word lines included in each redundant sub-array 1 can be substituted for a main word line pair included in any of the regular sub-arrays, as illustrated by Mark "x" and curved arrows in FIG. 3. In addition, since each of eight pairs of complementary main word lines contains four sub-word lines, if each one of the sub-word lines is individually substituted, it is possible to replace 32 defective portions ($8 \times 4 = 32$).

Figure 1:
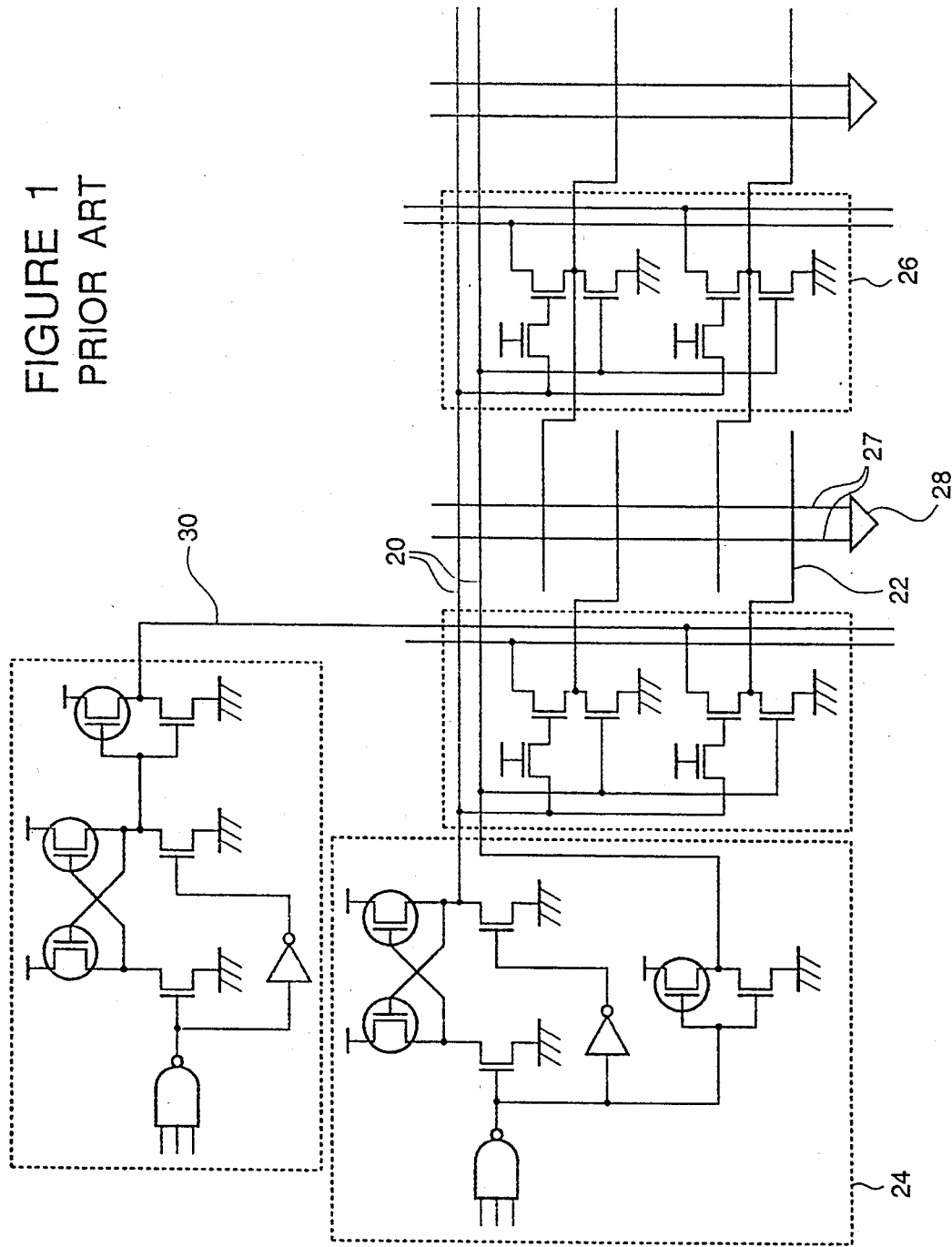
FIG. 1 is a circuit diagram showing one example of the double word line type dynamic RAM.
Figure 2:
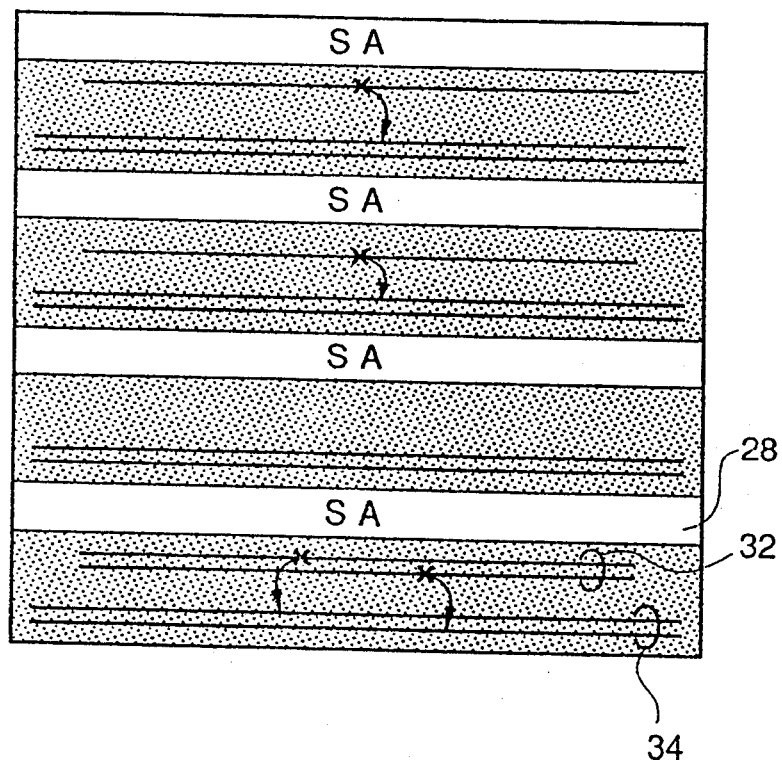
FIG. 2 is a diagrammatic layout illustrating a conventional redundant system for the dynamic RAM.

As mentioned above, if the substitutional sub-arrays is made small, the bit line (designated with Reference Numeral 27 in FIG. 1) becomes short, and therefore, a ratio of a cell capacitance to a bit line capacitance becomes larger than that in the regular sub-array. Accordingly, the operation margin of the substitutional cell is large as compared with that of the regular cell. This means to decrease probability that a substituted cell is defective, again.

In addition, in a high speed DRAM, it is preferable that both of a substituted cell and a cell to be replaced are operated by the sense amplifiers, and one of the two cells is selected when data is read out. In this case, if the redundant sub-array of substitutional cells is made to a necessary minimum extent, an overhead of a consumed current can be suppressed.

In the above explanation, the redundant sub-arrays are provided for repairing the word lines. However, redundant sub-arrays can be provided for repairing the bit lines. Namely, column redundant sub-arrays 2 sandwiched between a pair of redundant word driver arrays 4 are positioned at a left side or outside of left end word driver arrays 5 for the regular sub-arrays 10. Each of column redundant sub-arrays 2 contains redundant bit lines of the number remarkably smaller than the number of bit lines contained in the regular sub-array.

As mentioned above, since substitutional cells are concentrated into only one redundant sub-array in the row direction (and in the column direction), independently of the regular sub-arrays, even if a minimum substitution unit in the row direction and in the column direction is made large, increase of the chip area can be effectively suppressed. In addition, since the size of the redundant sub-array is made smaller than that of the regular sub-array, probability that a substituted cell is defective again can be reduced, and increase of the current when the substituted cell is accessed can be suppressed.

In the shown embodiment, the redundant sub-arrays are located at a periphery of the DRAM. However, the redundant sub-arrays can be located at a central zone of the DRAM. In this case, when the substituted cell is accessed, delay of the access time can be made small.

The invention has thus been shown and described with reference to the specific embodiments. However, it should be noted that the present invention is in no way limited to the details of the illustrated structures but changes and modifications may be made within the scope of the appended claims.

We claim:

1. A double word line type dynamic RAM comprising:

a plurality of regular sub-arrays each including a number of regular memory cells, said regular sub-arrays being arranged in the form of a matrix in such a manner that, the regular sub-arrays and word driver arrays for the regular sub-arrays are alternately located in a row direction, and the regular sub-arrays and sense amplifier arrays for the regular sub-arrays are alternately located in a column direction;

a main word decoder located along a column direction at the outside of the word driver array located at one side end in the row direction of said word driver arrays; and a row redundant sub-array positioned at the outside of the sense amplifier array located at one side end in the column direction of said sense amplifier arrays;

a redundant sense amplifier array located at the outside of said row redundant sub-array, and including a plurality of pairs of redundant complementary main word lines of the number remarkably smaller than the number of complementary main word lines contained in said regular sub-array, so that the size of said redundant sub-array is correspondingly remarkably smaller than the size of said regular sub-array.

2. A double word line type dynamic RAM claimed in claim 1 further including a column redundant sub-array sandwiched between a pair of redundant word driver arrays and positioned at the outside of the word driver array located at a side opposite to said main word decoder in the row direction, said column redundant sub-array containing redundant bit lines of the number remarkably smaller than the number of bit lines contained in said regular sub-array.

* * * * *